United States Patent [19]

Michalicek

[11] Patent Number: 6,156,652
[45] Date of Patent: Dec. 5, 2000

[54] POST-PROCESS METALLIZATION INTERCONNECTS FOR MICROELECTROMECHANICAL SYSTEMS

[75] Inventor: M. Adrian Michalicek, Broomfield, Colo.

[73] Assignee: The United States of America as represented by the Secretary of the Air Force, Washington, D.C.

[21] Appl. No.: 09/169,495

[22] Filed: Oct. 9, 1998

[51] Int. Cl.[7] .............................. H01L 21/82; H01L 21/44
[52] U.S. Cl. .......................... 438/674; 438/128; 438/598
[58] Field of Search ................................... 438/679, 674, 438/567, 584, 128, 598

[56] References Cited

U.S. PATENT DOCUMENTS 5,363,021 11/1994 Macdonald ............................. 315/366
5,783,340 7/1998 Farino et al. ............................ 430/22
5,867,302 2/1999 Fleming ................................. 359/291

OTHER PUBLICATIONS

M. A. Michalicek, J. H. Comtois, and H. K. Schriner, "Development of advanced second–generation micromirror devices fabricated in a four–level, planarized, surface–micromachined polysilicon process," *Proc. SPIE*, vol. 3292, pp. 71–80, 1998.

M. A. Michalicek, J. H. Comtois, and C. C. Barron, "Design and characterization of next–generation micromirrors fabricated in a four–level, planarized, surface–micromachined polysilicon process," *Proc. Innovative Systems In Silicon*, 2nd Ed., IEEE Press, pp. 144–154, 1997.

M. A. Michalicek, J. H. Comtois, and H. K. Schriner, "Design and fabrication of optical MEMS using a four–level, planarized, surface–micromachined polysilicon5 process," *Proc. SPIE*, vol. 3276, pp. 48–55, 1998.

*Primary Examiner*—Vu A. Le
*Assistant Examiner*—Adam Pyonin
*Attorney, Agent, or Firm*—Kenneth E. Callahan

[57] ABSTRACT

Large quantities of test MEMS devices are fabricated on a single chip with underlying addressable wiring connections. The wiring contains gaps that can be selectively shorted using a post-process metallization process. Deposition shields are photolithographically incorporated into the MEMS devices during the device fabrication process. These shields contain selected small gaps over certain unconnected wires. Subsequently, simple sputtering or evaporating deposition is used to deposit conductive materials onto the MEMS devices, thereby shorting the unconnected wires. Large quantities of devices can be shorted to active address wires by the metallization process in order of decreasing address potential or by testing preference. As a result, far more devices on a single chip can be individually tested and actuated than the number of bond pads that can be placed around the edge of the chip.

2 Claims, 2 Drawing Sheets

POST-PROCESS METALLIZATION INTERCONNECTS FOR MICROELECTROMECHANICAL SYSTEMS

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The field of Microelectromechanical Systems (MEMS) uses a variety of fabrication technologies, such as surface micromachining developed for the integrated circuit industry, to create highly miniaturized mechanical devices (usually 1 $\mu$m to 1 mm in size) on a microelectronic chip. This invention is in the field of microelectromechanical systems (MEMS), and in particular relates to post fabrication metallization techniques used to create interconnects for MEMS devices.

2. Description of the Prior Art

The majority of microelectromechanical systems (MEMS) in use today are fabricated in a variety of surface micromachining processes. Surface micromachined devices are formed by the alternate deposition of structural layers to form the device and sacrificial spacer layers to provide mechanical and electrical isolation. Polycrystalline silicon (polysilicon) is the most commonly used structural material and silicon dioxide (oxide) glass is the most commonly used sacrificial material. These layers, formed above a silicon substrate isolated with a layer of silicon nitride, are patterned (using the same advanced photolithography technology employed by the microelectronics industry) to form intricate structures such as motors, gears, mirrors, and various sensors. Cuts made through the oxide layers are used to anchor the upper structural levels to the substrate or to the underlying mechanical structures. At the end of the process, the sacrificial layers are removed using various techniques, such as a hydrofluoric acid release etch, which frees the device to move relative to the substrate. (M. A. Michalicek, J. H. Comtois, and H. K. Schriner, "Design and fabrication of optical MEMS using a four-level, planarized, surface-micromachined polysilicon5 process," *Proc. SPIE,* Vol. 3276, pp. 48–55, 1998.)

The complexity of the micromachines that can be manufactured in a given process is a function of the number of independent layers of structural material the technology provides. A single independent level of structural material limits designers to simple sensors. Geared mechanisms require two releasable structural layers, a Poly-1 layer to form the gears and a Poly-2 layer to form the locking hub above the ground layer (Poly-0). Motorized geared mechanisms require a minimum of three independent levels. Far more complex mechanisms and systems require even more structural layers.

Surface micromachining fabrication of electronics and MEMS is well developed and widely used both privately and commercially. Countless companies, universities, and government agencies have fabricated micromechanical devices for the last 10 years or more. However, one problem still plaguing designers is the limited number of wiring bonds that can be made per chip. Quite frequently there are more devices on the chip than there is room to place sufficient bond pads around the edge of the test chip. As a result, not all chips are made as functional as possible because many devices had to be wired together or not wired at all and therefore could not be electrically actuated and tested. To overcome this limit, a novel post-process metallization wiring interconnect was developed in which selected micromechanical devices can be wired to a "bus" of probe pads by masking and depositing a conductive material after the chip is fabricated.

SUMMARY OF THE INVENTION

In the present invention, small windows are cut into a post-process deposition shield that is built into the design layout of MEMS devices. Beneath each window is a single device address wiring line that is placed adjacent to an active wiring line leading to a probe or bond pad on the chip. This "near contact" wiring pattern is repeated for numerous micromechanical devices throughout the chip such that each address line lies adjacent to an active wiring line. Upon selecting a particular device or set of devices to be tested, that area of the chip is metallized with a conductive material. The deposition shield catches most of the material so that it does not harm wiring or other devices, but a small amount of the material passes through the window in the shield and forms an electrical contact between the two "near contact" wiring lines. Therefore, by metallizing the device, it becomes electrically connected to the probe or bond pad and becomes electrically accessible for testing.

DESCRIPTION OF THE PREFERRED EMBODIMENT

Post-process metallization can be used to extend the functionality of test chips containing more individual devices than can be successfully wired to bond pads and packaging leads. This invention can be used simply when the designer wishes to fabricate and test large quantities of devices on a single chip, but the number of bond pads that can be fabricated around the edge of the chip is significantly less. The maximum number of bond pads is determined by the required size of each pad and the amount or surface area around the edge of the chip. Each device must be probed or bonded to standard package leads to be tested and the practical limit on most MEMS chips is the availability of bond pads.

A post-process metallization contact was originally developed and used on several large arrays of individually addressable micromirrors where the number of devices drastically outnumbers the bond pads that can be placed around the edge of the test chip. Each array has a separate and electrically isolated bus of address wires that runs from the devices within the array. There is also a bus of active wiring lines that run from the set of probe or bond pads that must be shared between devices on the chip. Each individual wire of each array bus lies adjacent to an active wire from the bond pad bus. In other words, several devices (one from each array) makes a "near contact" with the same active wiring line. None of them, however, is directly wired to a probe pad.

Figure 1A:
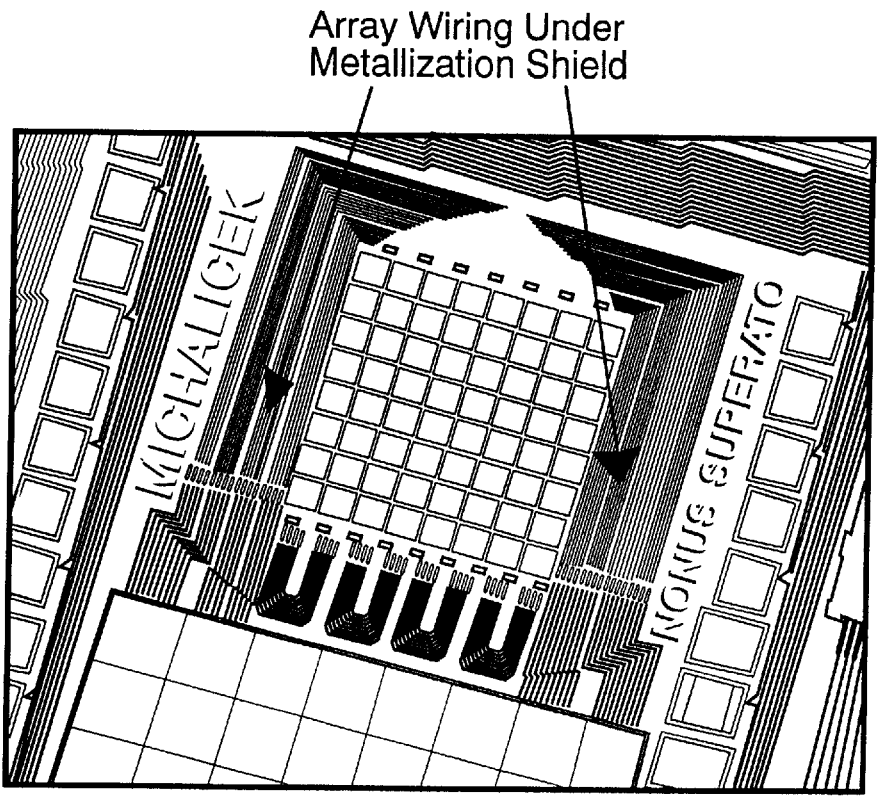
FIG. 1 contains micrographs of micromirror array interconnects used to share bond pad wiring.

A small window in the deposition shield is placed directly over each of the wiring gaps between the array bus and the probe pad bus. When a selected array of micromirror devices, or any micromechanical device, is selected for testing, the desired array is metallized by post-process deposition of a conductive material such as gold or aluminum. In doing so, the wiring that is exposed through the window in the deposition shield, located next to the array, is shorted, thereby wiring those devices to the bond pads making them accessible for testing. FIG. 1(a) shows how such wiring interconnects are used between two Flexure-Beam Micromirror Device (FBMD) micromirror arrays. When the second array is masked and metallized, the wiring gaps are shorted, thereby connecting its devices to the bond pads.

Figure 1B:
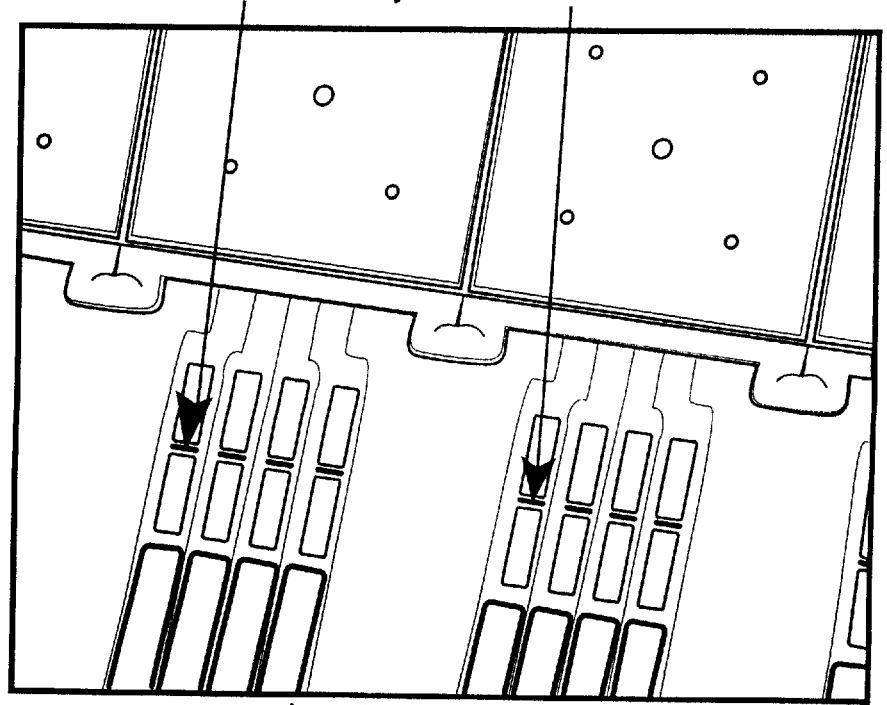

FIG. 1(b) shows a magnified view of the circled region shown in FIG. 1(a) and illustrates the gap in the address wiring which is visible beneath the deposition shield. Using this process, it was shown that a deposition of approximately 150 nm of gold resulted in sufficient electrical contacts between devices in the second micromirror array and the bond pads. Ultimately, this technique allowed for testing of five distinct arrays of at least 64 individually addressable micromirrors by the sharing of bond pads surrounding the arrays. It is not possible to place at least 320 bond pads around the test chip, so all arrays independently shared the 64 pads via the post-process metallization contacts.

Figure 2:
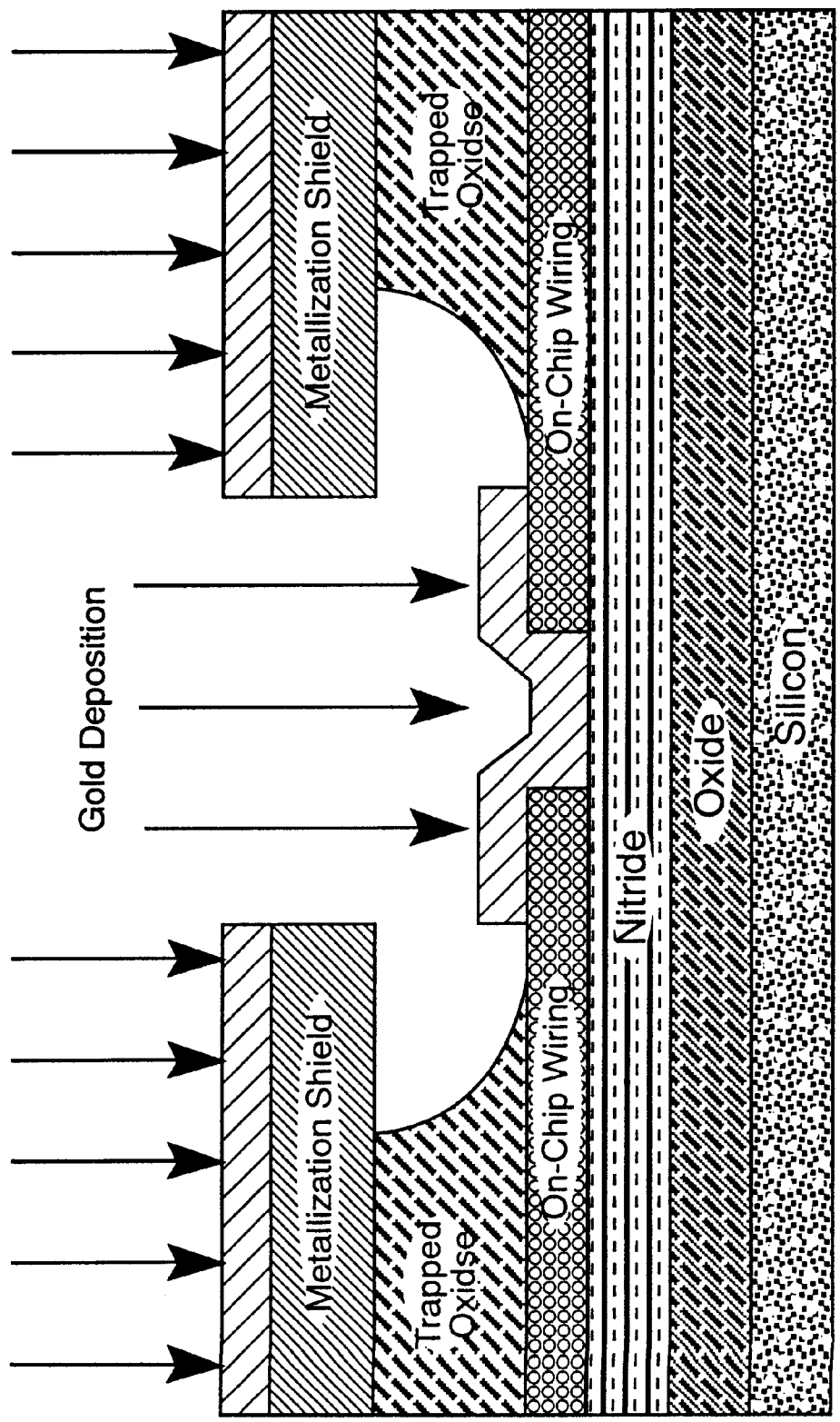
FIG. 2 is a side view of metallization contacts between on-chip wiring using gold deposition to connect wires.

A side view of this technique is shown in FIG. 2 in which a single contact is made beneath a window in the deposition shield. This image illustrates the process using gold deposition.

The designer receives a number of chips (as many as 200 chips) back from the foundry for each design. Using one chip for each array, this post-process deposition technique can be used to permanently wire each set of micromechanical devices to the bond pads that surround the chip. One chip is used for each array to be tested such that the desired array is shorted to the probe pads and becomes the only active array on that particular chip. This process is repeated on other chips for each array.

The bond pads are used to bond each address line of the chip to the standard integrated circuit package that is used to contain it. This is how the majority of microelectronic and micromechanical chips are tested and inserted into working applications. Using this invention on a single fabrication design, the designer can have numerous chips packaged that have different devices wired to the package. As a result, he or she can quickly and inexpensively create virtually any number of test devices and be limited only by the number of devices that can be placed on the chip.

I claim:

1. A method of creating interconnects using post-process metallization on microelectromechanical systems fabricated on a single chip, comprising
   a. fabricating microelectromechanical systems having an underlying address wiring system, said address wiring system having a plurality of unconnected address wires;
   b. photolithographically incorporating one or more shield layers into said microelectromechanical system during its fabrication such that said shield layer is positioned above any wiring or other structures not intended for subsequent metallization while leaving gaps in the shield layer over unconnected address wires;
   c. depositing a desired metallization material onto said microelectromechanical system array after the fabrication of said microelectromechanical system is complete, thereby shorting the unconnected wires lying beneath the shield layer gaps.

2. The method as set forth in claim 1 wherein the depositing process is by standard methods such as sputtering or by evaporative deposition.

* * * * *